United States Patent
Lin

(10) Patent No.: US 10,666,237 B1
(45) Date of Patent: May 26, 2020

(54) HIGH-SPEED CLOCKED COMPARATOR AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

(*) Notice: Subject to any disclaimer, the term of this patent is extended or adjusted under 35 U.S.C. 154(b) by 0 days.

(21) Appl. No.: 16/551,871

(22) Filed: Aug. 27, 2019

(51) Int. Cl.
*H03K 3/0233* (2006.01)

(52) U.S. Cl.
CPC .................................. *H03K 3/0233* (2013.01)

(58) Field of Classification Search
CPC combination set(s) only.
See application file for complete search history.

(56) References Cited

U.S. PATENT DOCUMENTS

| | | | |
|---|---|---|---|
| 4,206,316 A * | 6/1980 | Burnsweig | H04B 14/026 178/66.1 |
| 5,912,567 A | 6/1999 | Drost et al. | |
| 6,304,107 B1 | 10/2001 | Savage et al. | |
| 6,901,339 B2 * | 5/2005 | Eskeldson | G01R 31/3016 331/1 A |
| 8,957,802 B1 | 2/2015 | Evans | |
| 10,200,218 B2 * | 2/2019 | Tajalli | H04L 7/02 |

* cited by examiner

*Primary Examiner* — An T Luu
(74) *Attorney, Agent, or Firm* — McClure, Qualey & Rodack, LLP

(57) ABSTRACT

A clocked comparator includes an upper-side sampling latch configured to output a first decision in accordance with a detection of a sign of an input voltage signal plus an offset voltage at an edge of a clock signal; a lower-side sampling latch configured to output a second decision in accordance with a detection of a sign of the input voltage signal minus the offset voltage at the edge of the clock signal; and a decision-arbitrating latch configured to receive the first decision and the second decision and output a final decision in accordance with whichever one of the first decision and the second decision that is resolved earlier.

10 Claims, 6 Drawing Sheets

HIGH-SPEED CLOCKED COMPARATOR AND METHOD THEREOF

BACKGROUND OF THE DISCLOSURE

Field of the Disclosure

The present disclosure generally relates to clocked comparators and more particularly to a high-speed clocked comparator circuit and method for operating same.

Description of Related Art

As is known, a conventional clocked comparator receives a voltage signal and outputs a decision in accordance with a clock signal. Upon an edge of the clock signal, a sign of the voltage signal is detected and represented by the decision: the decision is 1 if the sign is positive, and 0 otherwise. The decision needs to be resolved before the arrival of a next edge of the clock signal. The time it takes the clocked comparator to resolve the decision depends on a magnitude of the voltage signal at the instant of the edge: the greater magnitude, the faster the decision can be resolved.

To illustrated, designating the voltage signal to be detected as $V_X$, the time it takes to resolve the decision of the sign of $V_X$ as z, and the time allowed for resolving the decision as $\tau_M$. A typical transfer characteristic between $V_X$ and z is shown in FIG. 1. As shown, the decision is 1 if $V_X>0$, but the decision can be made within the allowed time $\tau_M$ only if $V_X$ is above a threshold voltage $V_M$, and z rises rapidly as $V_X$ approaches zero. Likewise, the decision is 0 if $V_X<0$, but the decision can be made within the allowed time $\tau_M$ only if $V_X$ is below $-V_M$, and τ rises rapidly as $V_X$ approaches zero. The clocked comparator will fail to resolve the decision within $\tau_M$ if $|V_X|<V_M$. This problem is known as "metastability" and may lead to a serious error. The metastability problem is more serious when a clock frequency of the clock signal is higher. For instance, for a 25 Gigabit per second serial link, a unit interval of data is 40 ps, and a decision needs to be resolved within 40 ps. The voltage signal, however, is usually small in practice and takes a long time to resolve. This is an important limiting factor of a performance of a high-speed serial link receiver.

Systems and methods are known that are directed to address the metastability problem. However, most known systems and methods are based on detecting and/or correcting an error of metastability.

BRIEF DESCRIPTION OF THIS DISCLOSURE

In an embodiment, a clocked comparator comprises: an upper-side sampling latch configured to output a first decision in accordance with a detection of a sign of an input voltage signal plus an offset voltage at an edge of a clock signal; a lower-side sampling latch configured to output a second decision in accordance with a detection of a sign of the input voltage signal minus the offset voltage at the edge of the clock signal; and a decision-arbitrating latch configured to receive the first decision and the second decision and output a final decision in accordance with whichever one of the first decision and the second decision that is resolved earlier.

In an embodiment, a method comprises: receiving an input voltage signal and a clock signal; resolving a first decision using a first sampling latch configured to detect a sign of the input voltage signal plus an offset voltage at an edge of the clock signal; resolving a second decision using a second sampling latch configured to detect a sign of the input voltage signal minus the offset voltage at the edge of the clock signal; and resolving a final decision using a decision-arbitrating latch configured to receive the first decision and the second decision and output the final decision in accordance with whichever one of the first decision and the second decision that is resolved earlier.

DETAILED DESCRIPTION OF THIS DISCLOSURE

Figure 1:
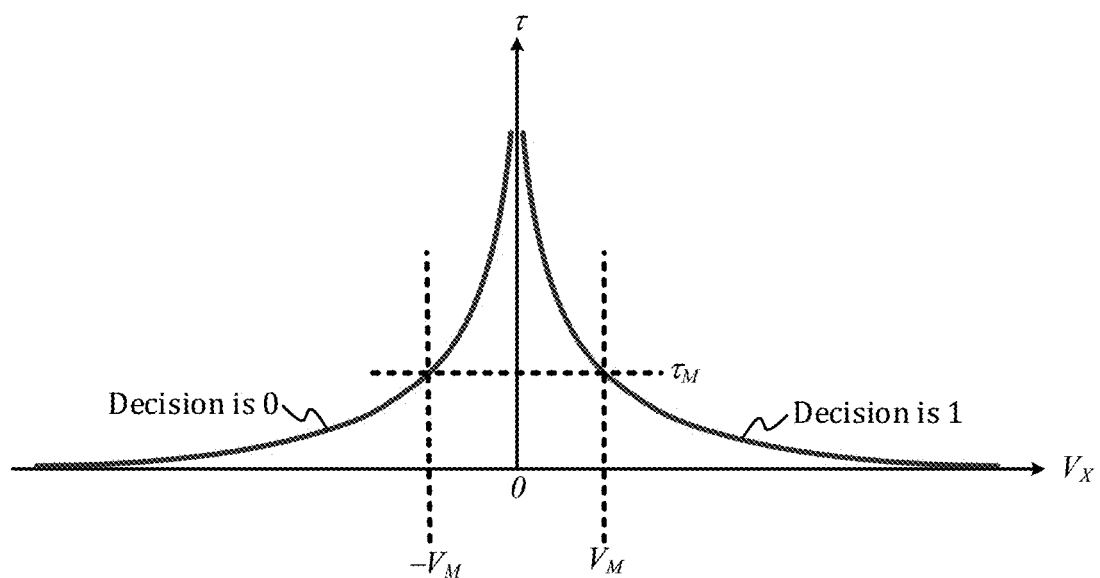
FIG. 1 shows a transfer characteristic of a prior art clocked comparator.

The present disclosure is directed to clocked comparator. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "current," "node," "signal," "clock," "CMOS (complementary metal oxide semiconductor)," "NMOS (N-channel metal oxide semiconductor) transistor," "PMOS (N-channel metal oxide semiconductor) transistor," "differential pair," "pseudo-differential pair," "switch," "latch," "inverter," "clock," "frequency," "logical signal," "return-to-zero," "non-return-to-zero," "pull up," "pull down" and "differential signal." Terms like these are used in a context of microelectronics, and the associated concepts are apparent to those of ordinary skills in the art and thus will not be explained in detail here. Those of ordinary skill in the art can also recognize a symbol of a NMOS transistor and a symbol of a PMOS transistor and identify the "source," the "gate," and the "drain" terminals thereof. Those of ordinary skills in the art also understand units such as μm (micron), nm (nanometer), and ps (picosecond).

This present disclosure is disclosed from an engineering perspective. For instance, "X is equal to Y" means "a difference between X and Y is smaller than a specified engineering tolerance"; "X is much smaller than Y" means "X divided by Y is smaller than an engineering tolerance"; and "X is zero" means "X is smaller than a specified engineering tolerance."

In this disclosure, a signal is either a voltage or a current that represents information.

A logical signal is a voltage signal of two states: a high state and a low state. A logical signal is said to be in the high (low) state when a level of said logical signal is above (below) a certain level or trip point pertaining to said logical signal. Stating "(the logical signal) X is high," is stating it in a context of logical signal and what is meant is: "(the logical signal) X is in the high state." Stating "(the logical signal) X is low," is stating it in a context of logical signal and what is meant is: "(the logical signal) X is in the low state." The high state is also known as the "1" state, and the low state is also known as the "0" state. Stating that "(the logical signal) X is 1," is stating it in a context of logical signal and what is meant is: "(the logical signal) X is in the high state." Likewise, stating that "(the logical signal) X is 0," is stating it in a context of logical signal and what is meant is: "(the logical signal) X is in the low state."

A "clock signal" (or simply a "clock") is a logical signal that cyclically toggles between a high state and a low state.

Throughout this disclosure, "$V_{DD}$" denotes a power supply node. For convenience, "$V_{DD}$" can also refer to a power supply voltage provided at the power supply node. That is, "$V_{DD}$ is 0.9V" means "a power supply voltage at the power supply node $V_{DD}$ is 0.9V." By way of example but not limitation, throughout this disclosure a circuit is fabricated using a 28 nm CMOS (complementary metal oxide semiconductor) process and $V_{DD}$ is 0.9V.

Throughout this disclosure, a differential signaling scheme is used, wherein a voltage signal comprises two voltages denoted with suffixes "+" and "−," respectively, attached in subscript, and a value of the voltage signal is represented by a difference between said two voltages. For instance, $V_X$ ($D_1$, $D_2$, $D'_1$, $D'_2$) comprises $V_{X+}$ ($D_{1+}$, $D_{2+}$, $D'_{1+}$, $D'_{2+}$) and $V_{X-}$ ($D_{1-}$, $D_{2-}$, $D'_{1-}$, $D'_{2-}$), and a value of $V_X$ ($D_1$, $D_2$, $D'_1$, $D'_2$) is represented by a difference between $V_{X+}$ ($D_{1+}$, $D_{2+}$, $D'_{1+}$, $D'_{2+}$) and $V_{X-}$ ($D_{1-}$, $D_{2-}$, $D'_{1-}$, $D'_{2-}$). Likewise, a current signal comprises two currents denoted with suffixes "+" and "−," respectively, attached in subscript. For instance, $I_X$ ($I_1$, $I_2$, $I'_1$, $I'_2$) comprises $I_{X+}$ ($I_{1+}$, $I_{2+}$, $I'_{1+}$, $I'_{2+}$) and $I_{X-}$ ($I_{1-}$, $I_{2-}$, $I'_{1-}$, $I'_{2-}$) and a value of $I_X$($I_1$, $I_2$, $I'_1$, $I'_2$) is represented by a difference between $I_{X+}$ ($I_{1+}$, $I_{2+}$, $I'_{1+}$, $I'_{2+}$) and $I_{X-}$ ($I_{1-}$, $I_{2-}$, $I'_{1-}$, $I'_{2-}$).

Figure 2A:
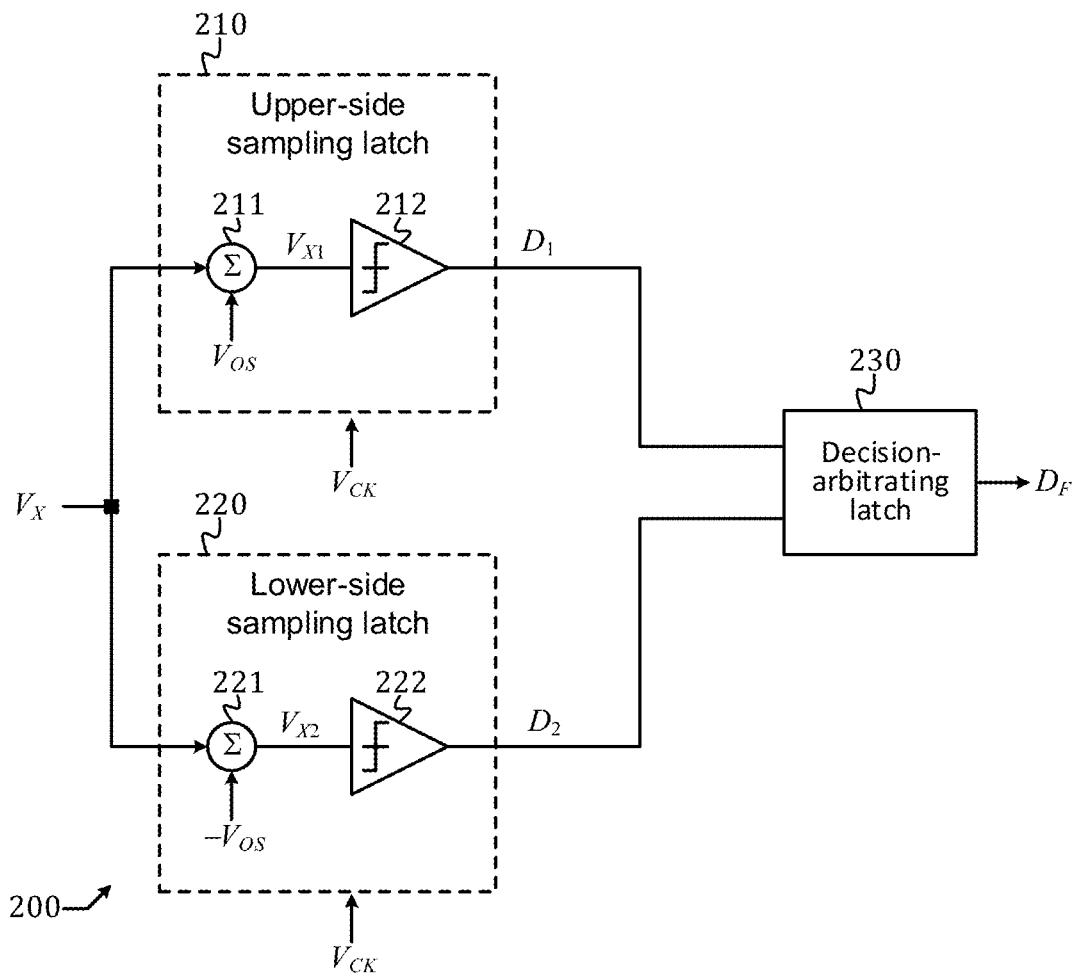
FIG. 2A shows a conceptual functional block diagram of a clocked comparator in accordance with an embodiment of the present disclosure.

This present disclosure is based on exploiting a characteristic of metastability (of clocked comparator) to virtually eliminate metastability. A conceptual functional block diagram of a clocked comparator 200 in accordance with an embodiment of the present disclosure is depicted in FIG. 2A. Clocked comparator 200 comprises: an upper-side sampling latch 210 configured to receive an input voltage $V_X$ and output a first decision $D_1$ in accordance with a clock signal $V_{CK}$; a lower-side sampling latch 220 configured to receive the input voltage $V_X$ and output a second decision $D_2$ in accordance with the clock signal $V_{CK}$; and a decision-arbitrating latch 230 configured to receive the first decision $D_1$ and a second decision $D_2$ and output a final decision $D_F$.

The upper-side sampling latch 210 comprises a first offset circuit 211 and a first clocked arbiter 212. The first offset circuit 211 embodies the following function:

$$V_{X1} = V_X + V_{OS}, \quad (1)$$

where $V_{OS}$ is an offset voltage that is greater than a threshold voltage $V_M$ determined by a metastability condition of the first clocked arbiter 212, and $V_{X1}$ is an upshifted voltage. The first clocked arbiter 212 embodies the following function:

$$D_1 = \begin{cases} 1 & \text{if } V_{X1} > 0 \text{ at a sampling instant defined by } V_{CK} \\ 0 & \text{otherwise} \end{cases} \quad (2)$$

Therefore, the upper-side sampling latched 210 embodies a function that can be mathematically modeled by the following equation:

$$D_1 = \begin{cases} 1 & \text{if } (V_X + V_{OS}) > 0 \text{ at a sampling instant defined by } V_{CK} \\ 0 & \text{otherwise} \end{cases} \quad (3)$$

The lower-side sampling latch 220 comprises a second offset circuit 221 and a second clocked arbiter 222. The second offset circuit 221 embodies the following function:

$$V_{X2} = V_X - V_{OS} \quad (4)$$

where $V_{X2}$ is a downshifted voltage. The second clocked arbiter 222 embodies the following function:

$$D_2 = \begin{cases} 1 & \text{if } V_{X2} > 0 \text{ at a sampling instant defined by } V_{CK} \\ 0 & \text{otherwise} \end{cases} \quad (5)$$

Therefore, the lower-side sampling latched 220 embodies a function that can be mathematically modeled by the following equation:

$$D_2 = \begin{cases} 1 & \text{if } (V_X - V_{OS}) > 0 \text{ at a sampling instant defined by } V_{CK} \\ 0 & \text{otherwise} \end{cases} \quad (6)$$

Figure 2B:
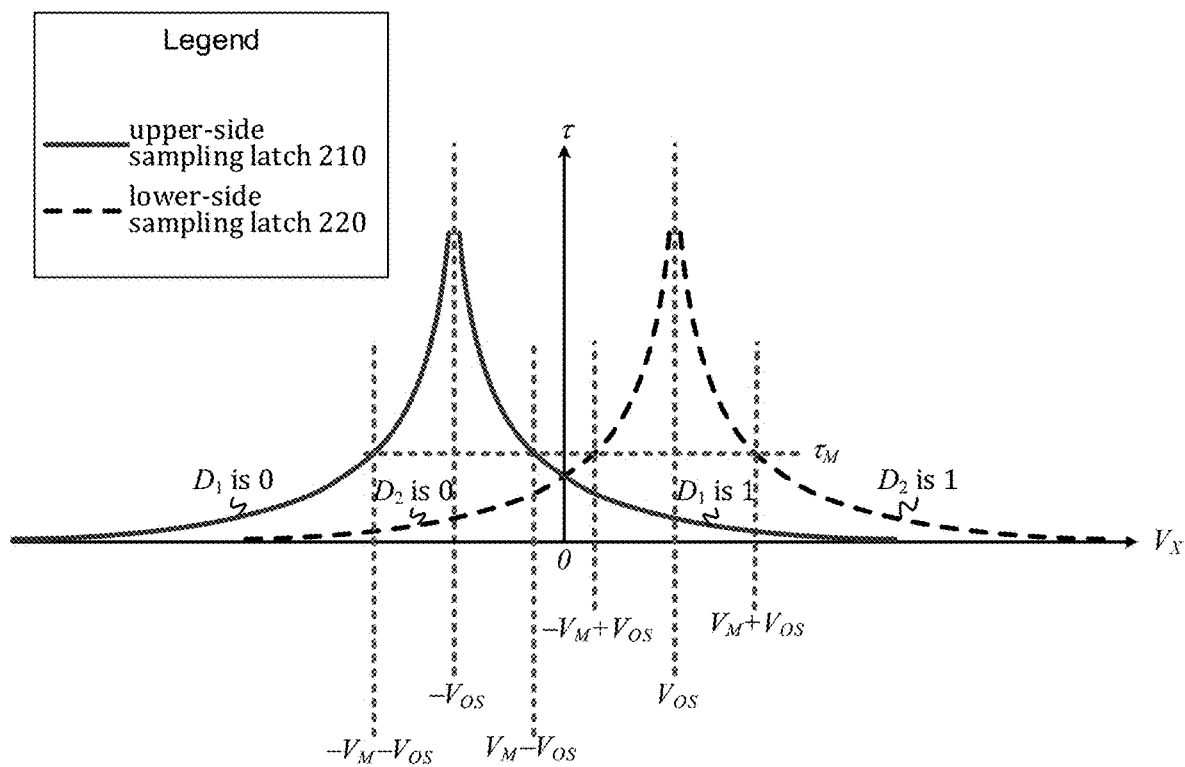
FIG. 2B shows a transfer characteristic of the clocked comparator of FIG. 2A.

Exemplary transfer characteristics between $V_X$ and $\tau$ (which is a time needed to resolve a decision for $V_X$) for the two sampling latches 210 and 220 are shown in FIG. 2B. Here, we assume the first clocked arbiter 212 and the second clocked arbiter 222 are embodied by the same clocked comparator that has the transfer characteristic shown in FIG. 1. As shown, the transfer characteristics in FIG. 2B are the same as that in FIG. 1 except that the upper-side sampling latches 210 (whose transfer characteristics are shown in a solid line) has an offset of $-V_{OS}$ in the horizontal axis (i.e. shifted to the left by $V_{OS}$), while the lower-side sampling latch 220 (whose transfer characteristics are shown in a dashed line) has an offset of $V_{OS}$ in the horizontal axis (i.e. shifted to the right by $V_{OS}$). For the upper-side sampling latch 210, $D_1$ is 1 when $V_X$ is greater than $-V_{OS}$ and 0 otherwise. However, the upper-side sampling latch 210 will encounter metastability (i.e. fail to resolve within $\tau_M$) when $V_X$ is between $-V_M - V_{OS}$ and $V_M - V_{OS}$, as $|V_X + V_{OS}|$ is smaller than $V_M$. For the lower-side sampling latch 220, $D_2$ is 1 when $V_X$ is greater than $V_{OS}$ and 0 otherwise. However, the lower-side sampling latch 220 will encounter metastability (i.e. fail to resolve within $\tau_M$) when $V_X$ is between $-V_M + V_{OS}$ and $V_M + V_{OS}$, as $|V_X - V_{OS}|$ is smaller than $V_M$. A table of values of $D_1$ and $D_2$ along with a correct decision of $V_X$ versus $V_X$ is shown below.

| $V_X$ | Correct decision | $D_1$ | $D_2$ |
|---|---|---|---|
| below $-V_M - V_{OS}$ | 0 | 0 | 0 |
| between $-V_M - V_{OS}$ and | 0 | metastable | 0 |

-continued

| $V_X$ | Correct decision | $D_1$ | $D_2$ |
|---|---|---|---|
| $V_M - V_{OS}$ | | | |
| between $V_M - V_{OS}$ and 0 | 0 | 1 but resolved later than $D_2$ | 0 and resolved earlier than $D_1$ |
| between 0 and $-V_M + V_{OS}$ | 1 | 1 and resolved earlier than $D_2$ | 0 but resolved later than $D_1$ |
| between $-V_M + V_{OS}$ and $V_M + V_{OS}$ | 1 | 1 | metastable |
| above $V_M + V_{OS}$ | 1 | 1 | 1 |

The correct decision is 1 if $V_X>0$ and 0 if $V_X<0$. From the table, whichever one of the two decisions $D_1$ and $D_2$ that gets resolved earlier will be the correct decision, and the metastability thus can be virtually eliminated for the correct decision.

Now refer to FIG. 2A. The decision-arbitrating latch 230 embodies the following function:

$$D_F = \begin{cases} D_1 & \text{if } D_1 \text{ is resolved earlier than } D_2 \\ D_2 & \text{otherwise} \end{cases} \quad (7)$$

Figure 3:
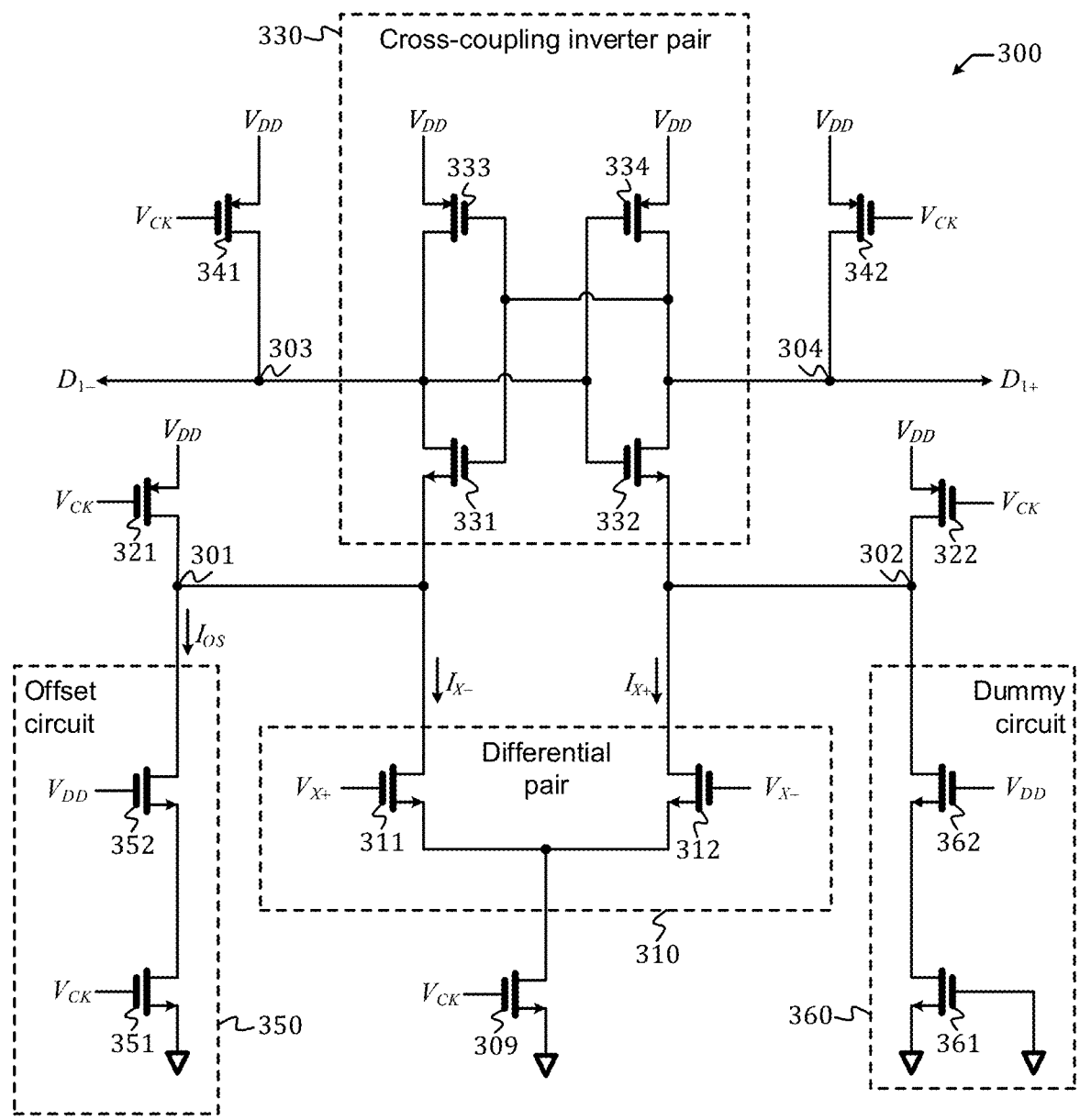
FIG. 3 shows a schematic diagram of a sampling latch in accordance with an embodiment of the present invention.

A schematic diagram of a sampling latch 300 that can be used to embody the upper-side sampling latch 210 is shown in FIG. 3. Sampling latch 300 is in a reset state when $V_{CK}$ is low and is in a resolution state when $V_{CK}$ is high. Sampling latch 300 comprises: NMOS transistors 309, 311, 312, 351, 352, 361, 362, 331, and 332, and PMOS transistors 321, 322, 333, 334, 341, and 342. NMOS transistor 309 embodies a switch configured to enable a comparison between $V_{X+}$ and $V_{X-}$ when $V_{CK}$ is high; NMOS transistors 311 and 312 embody a differential pair 310 configured to receive $V_{X+}$ and $V_{X-}$ and draw currents $I_{X-}$ and $I_{X+}$ from nodes 301 and 302, respectively to embody a comparison between $V_{X+}$ and $V_{X-}$; NMOS transistors 331 and 332 along with PMOS transistors 333 and 334 form a cross-coupling inverter pair 330 configured to establish $D_{1-}$ and $D_{1+}$ in accordance with currents drawn from nodes 301 and 302; PMOS transistors 321, 322, 341, and 342 embody pull-up switches configured to pull up nodes 301, 302, 303, and 304, respectively, to $V_{DD}$ and effectively reset a state of the cross-coupling inverter pair 330 when $V_{CK}$ is low; NMOS transistor 351 and 352 embody an offset circuit 350 configured to draw an offset current $I_{OS}$ from node 301 and thus give $V_{X+}$ an advantage over $V_{X-}$ during a comparison when $V_{CK}$ is high; and NMOS transistors 361 and 362 embody a dummy circuit 360 configured to make the overall circuitry more balanced. Upon a rising edge of the clock signal $V_{CK}$, node 301 will be pulled down regardless of a value of $V_{X+}$ thanks to the offset current $I_{OS}$, while node 302 might be pulled down, depending on a value of $V_{X-}$. If node 301 (302) is pulled down faster than node 302 (301), $D_{1-}(D_{1+})$ will be latched to 0 while $D_{1+}(D_{1-})$ will be latched to 1, thanks to the cross-coupling inverter pair 330.

Except for the offset circuit 350 and the dummy circuit 360, sampling latch 300 is widely known in the prior art as a "strong-arm latch" and thus not explained in detail here. That the offset circuit 350 can give $V_{X+}$ an advantage over $V_{X-}$ during a comparison is understood to those of ordinary skill in the art and thus not described in detail here. The function of the offset circuit 211 and the offset voltage $V_{OS}$ in FIG. 2A are implied by the advantage that $V_{X+}$ has due to the offset current $I_{OS}$ provided by the offset circuit 350. That the dummy circuit 360 can make the overall circuitry more balanced is also understood to those of ordinary skill in the art and thus not explained in detail here.

The offset current $I_{OS}$ from the offset circuit 350 must be sufficiently large that when $V_{X+}$ is equal to $V_{X-}$, $D_{1-}$ can be latched to 0 within the maximum time allowed.

By way of example, but not limitation, widths/lengths of NMOS transistors 309, 311, 312, 351, 352, 361, 362, 331, and 332 are: 4 μm/30 nm, 4 μm/30 nm, 4 μm/30 nm, 1 μm/30 nm, 1 μm/30 nm, 1 μm/30 nm, 1 μm/30 nm, 3 μm/30 nm, and 3 μm/30 nm, respectively; and widths/lengths of PMOS transistors 321, 322, 333, 334, 341, and 342 are: 2 μm/30 nm, 2 μm/30 nm, 3 μm/30 nm, 3 μm/30 nm, 3 μm/30 nm, and 3 μm/30 nm, respectively.

Sampling latch 300 can be used to embody the lower-side sampling latch 220 by replacing $V_{X+}$, $V_{X-}$, $D_{1+}$, and $D_{1-}$ with $V_{X-}$, $V_{X+}$, $D_{2-}$, and $D_{2+}$, respectively. In this case, the offset circuit 350 can give $V_{X-}$ an advantage over $V_{X+}$ during a comparison. Note the upper-side sampling latch 210 is of the same circuit as the lower-side sampling latch 220 except for a polarity inversion in both the input and the output.

Figure 4:
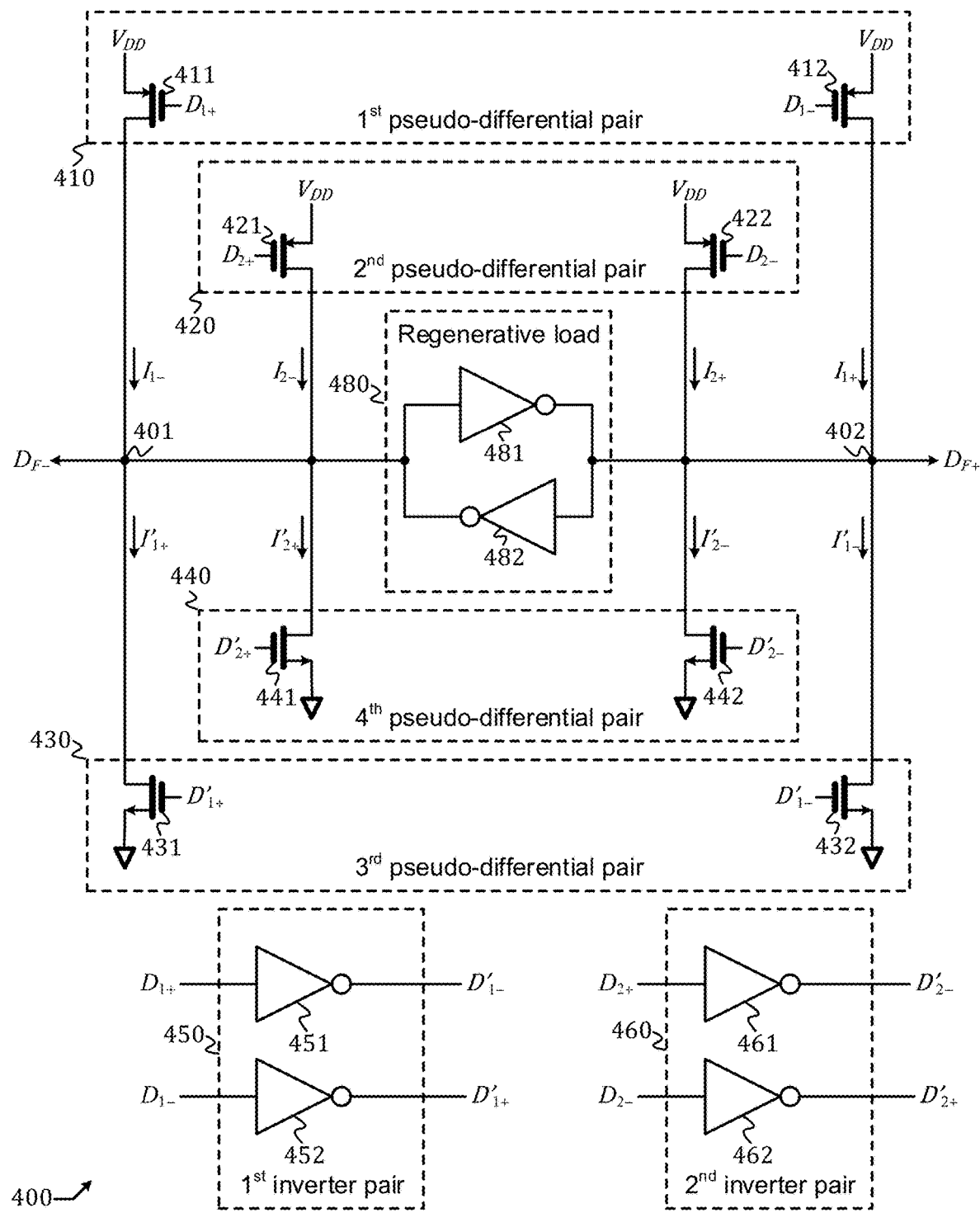
FIG. 4 shows a schematic diagram of a decision-arbitrating latch in accordance with an embodiment of the present invention.

A schematic diagram of a decision-arbitrating latch 400 that can be used to embody decision-arbitrating latch 230 is shown in FIG. 4. Decision-arbitrating latch 400 comprises: a 1$^{st}$ inverter pair 450 comprising inverters 451 and 452 configured to receive $D_{1+}$ and $D_{1-}$ and output $D'_{1-}$ and $D'_{1+}$, respectively, wherein $D'_{1+}$ and $D'_{1-}$ jointly embody a first auxiliary decision $D'_1$; a 2$^{nd}$ inverter pair 460 comprising inverters 461 and 462 configured to receive $D_{2+}$ and $D_{2-}$ and output $D'_{2-}$ and $D'_{2+}$, respectively, wherein $D'_{2+}$ and $D'_{2-}$ jointly embody a second auxiliary decision $D'_2$; a 1$^{st}$ pseudo-differential pair 410 comprising PMOS transistors 411 and 412 configured to receive $D_{1+}$ and $D_{1-}$ and supply currents $I_{1-}$ and $I_{1+}$ to nodes 401 and 402, respectively; a 2$^{nd}$ pseudo-differential pair 420 comprising PMOS transistors 421 and 422 configured to receive $D_{2+}$ and $D_{2-}$ and supply currents $I_{2-}$ and $I_{2+}$ to nodes 401 and 402, respectively; a 3$^{rd}$ pseudo-differential pair 430 comprising NMOS transistors 431 and 432 configured to receive $D'_{1+}$ and $D'_{1-}$ and draw currents $I'_{1+}$ and $I'_{1-}$ from nodes 401 and 402, respectively; a 4$^{th}$ pseudo-differential pair 440 comprising NMOS transistors 441 and 442 configured to receive $D'_{2+}$ and $D'_{2-}$ and draw currents $I'_{2+}$ and $I'_{2-}$ from nodes 401 and 402, respectively; and a cross-coupling inverter pair 480 comprising inverters 481 and 482 configured to embody a regenerative load across nodes 401 and 402.

Figure 5:
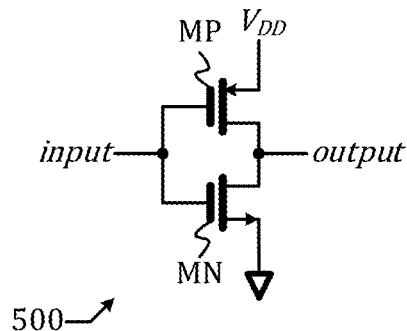
FIG. 5 shows a schematic diagram of an inverter.

A schematic diagram of an inverter 500 that can be instantiated to embody inverters 451, 452, 461, 462, 481, and 482 is shown in FIG. 5. Inverter 500 comprises a NMOS transistor MN and a PMOS transistor MP and is well understood by those of ordinary skill in the art and thus not explained in detail here.

When $V_{CK}$ is low, the upper-side sampling latch 210 and the lower-side sampling latch 220 are reset, $D_{1+}$, $D_{1-}$, $D_{2+}$ and $D_{2-}$ are all pulled up to $V_{DD}$ (see FIG. 3); consequently, $D'_{1+}$, $D'_{1-}$, $D'_{2+}$ and $D'_{2-}$ are all pulled down to ground by inverters 452, 451, 462, and 461, respectively. As a result, PMOS transistors 411, 412, 421, and 422 and NMOS transistors 431, 432, 441, and 442 are all shut off and the cross-coupling inverter pair 480 is latched to a present state.

Upon a rising edge of $V_{CK}$, the upper-side sampling latch 210 and the lower-side sampling latch 220 are enabled and $D_1$ and $D_2$ are being resolved. There are two possibilities for $D_1$ as summarized by the following table:

| $D_1$ is resolved to be 1 | $D_1$ is resolved to be 0 |
|---|---|
| $D_{1+}$ remains high | $D_{1+}$ drops to ground |
| $D_{1-}$ drops to ground | $D_{1-}$ remains high |
| $D'_{1-}$ remains low | $D'_{1-}$ rises to VDD |
| $D'_{1+}$ rises to $V_{DD}$ | $D'_{1+}$ remains low |
| PMOS transistor 412 is pulling up $D_{F+}$ (via $I_{1+}$) | PMOS transistor 411 is pulling up $D_{F-}$ (via $I_{1-}$) |
| NMOS transistor 431 is pulling down $D_{F-}$ (via $I'_{1+}$) | NMOS transistor 432 is pulling down $D_{F+}$ (via $I'_{1-}$) |
| PMOS transistor 411 and NMOS transistor 432 remain shut off | PMOS transistor 412 and NMOS transistor 431 remain shut off |

There are two possibilities for $D_2$ as summarized by the following table:

| $D_2$ is resolved to be 1 | $D_2$ is resolved to be 0 |
|---|---|
| $D_{2+}$ remains high | $D_{2+}$ drops to ground |
| $D_{2-}$ drops to ground | $D_{2-}$ remains high |
| $D'_{2-}$ remains low | $D'_{2-}$ rises to $V_{DD}$ |
| $D'_{2+}$ rises to $V_{DD}$ | $D'_{2+}$ remains low |
| PMOS transistor 422 is pulling up $D_{F+}$ (via $I_{2+}$) | PMOS transistor 421 is pulling up $D_{F-}$ (via $I_{2-}$) |
| NMOS transistor 441 is pulling down $D_{F-}$ (via $I'_{2+}$) | NMOS transistor 442 is pulling down $D_{F+}$ (via $I'_{2-}$) |
| PMOS transistor 421 and NMOS transistor 442 remain shut off | PMOS transistor 422 and NMOS transistor 441 remain shut off |

If both $D_1$ and $D_2$ are resolved to be 1, $D_{F+}$ will be pulled up to $V_{DD}$ by both PMOS transistors 412 and 422 and $D_{F-}$ will be pulled down to ground by both NMOS transistors 431 and 441, and the regenerative load 480 will help to latch the state. If both $D_1$ and $D_2$ are resolved to be 0, $D_{F-}$ will be pulled up to $V_{DD}$ by both PMOS transistors 411 and 421 and $D_{F+}$ will be pulled down to ground by both NMOS transistors 432 and 442, and the regenerative load 480 will help to latch the state. As shown in FIG. 2B, if $V_{OS}$ is larger than $V_M$, it is impossible that both $D_1$ and $D_2$ can be metastable. If either one of $D_1$ and $D_2$ is in a metastability (i.e. fails to resolve in a timely manner), the other one will not be metastable and can establish the final decision $D_F$ on its own. If $D_1$ and $D_2$ are resolved to different values, a racing condition occurs, wherein one of PMOS transistors 411 and 421 is trying to pull up $D_{F-}$ and one of NMOS transistors 431 and 441 is trying to pull down $D_{F-}$, and at the same time one of PMOS transistors 412 and 422 is trying to pull up $D_{F+}$ and one of NMOS transistors 432 and 442 is trying to pull down $D_{F+}$. In this case, the one (between $D_1$ and $D_2$) that gets resolved earlier will have a head start and dictate the final decision, due to a latch function provided by the regenerative load 480.

For instance, if $D_1$ ($D_2$) is resolved to be 1, $D_2$ ($D_1$) is resolved to be 0, but $D_1$ ($D_2$) is resolved earlier than $D_2$ ($D_1$), then PMOS transistor 412 (422) will start pulling up $D_{F+}$ before NMOS transistor 442 (432) starts pulling down $D_{F+}$, and NMOS transistor 431 (441) will start pulling down $D_{F-}$ before PMOS transistor 421 (411) starts pulling up $D_{F-}$; as a result, $D_{F+}$ and $D_{F-}$ will be latched to 1 and 0, respectively, thanks to the regenerative load 480. On the other hand, if $D_1$ ($D_2$) is resolved to be 0, $D_2$ ($D_1$) is resolved to be 1, but $D_1$ ($D_2$) is resolved earlier than $D_2$ ($D_1$), then PMOS transistor 411 (421) will start pulling up $D_{F-}$ before NMOS transistor 441 (431) starts pulling down $D_{F-}$, and NMOS transistor 432 (442) will start pulling down $D_{F+}$ before PMOS transistor 422 (412) starts pulling up $D_{F+}$; as a result, $D_{F+}$ and $D_{F-}$ will be latched to 0 and 1, respectively, thanks to the regenerative load 480.

By way of example, but not limitation: widths/lengths of NMOS transistor 431, 432, 441, 442 are all 2 μm/30 nm; widths/lengths of PMOS transistor 411, 412, 421, 422 are all 3 μm/30 nm; and for inverters 451, 452, 461, 462, 481, and 482, width/length of PMOS transistor MP therein is 1.5 μm/30 nm and width/length of NMOS transistor MN therein is 1 μm/30 nm.

Note that the decision-arbitrating latch 400 may still work if inverters 451, 452, 461, 462 and NMOS transistors 431, 432, 441, 442 are removed. For instance, if $D_{F+}$ is pulled up by PMOS transistor 412 and/or PMOS transistor 422, $D_{F-}$ can still be pulled down by inverter 482; if $D_{F-}$ is pulled up by PMOS transistor 411 and/or PMOS transistor 421, $D_{F+}$ can still be pulled down by inverter 481. In this case, however, the decision-arbitrating latch 400 will likely be slower due to having no direct pull-down currents ($I'_{1+}$, $I'_{1-}$, $I'_{2+}$, $I'_{2-}$) and must fully rely on the regenerative load 480 to enforce the pull-down after the pull-up happens.

Figure 6:
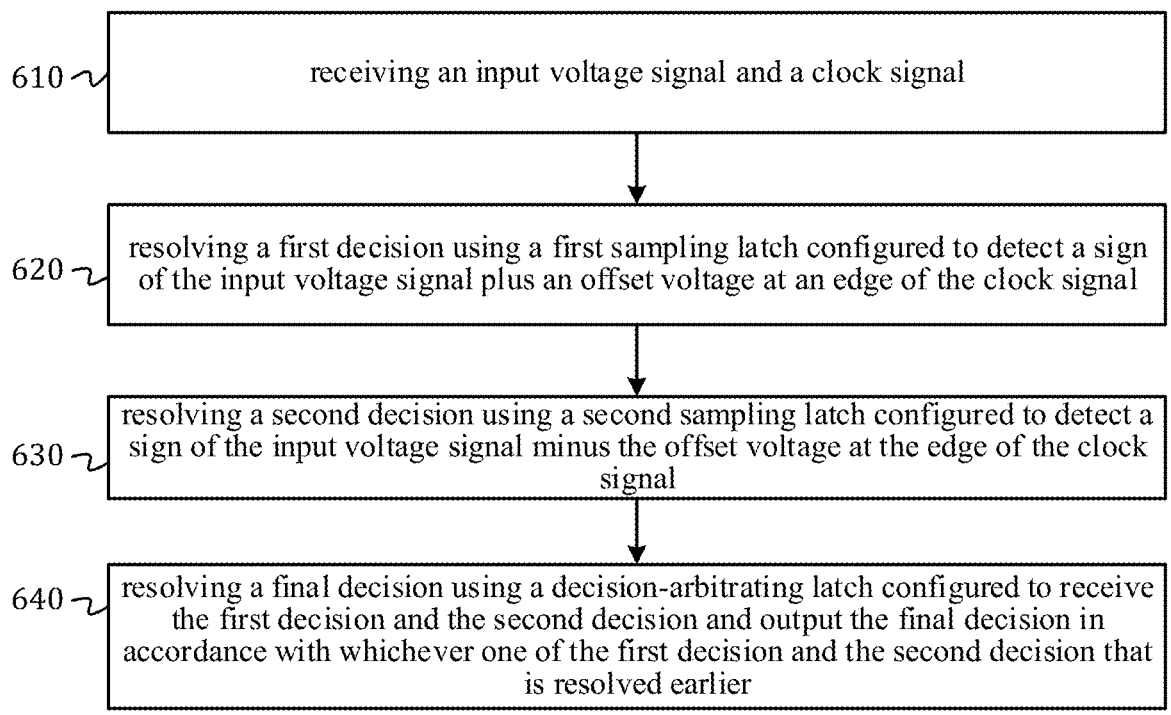
FIG. 6 shows a flow diagram of a method in accordance with the present invention.

As shown in a flow diagram depicted in FIG. 6, a method in accordance with an embodiment of the present disclosure comprises: (step 610) receiving an input voltage signal and a clock signal; (step 620) resolving a first decision using a first sampling latch configured to detect a sign of the input voltage signal plus an offset voltage at an edge of the clock signal; (step 630) resolving a second decision using a second sampling latch configured to detect a sign of the input voltage signal minus the offset voltage at the edge of the clock signal; (step 640) and resolving a final decision using a decision-arbitrating latch configured to receive the first decision and the second decision and output the final decision in accordance with whichever one of the first decision and the second decision that is resolved earlier.

This present disclosure can be very useful in a high-speed serial link receiver, wherein a decision must be resolved within a very short period of time.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A clocked comparator comprising:
    an upper-side sampling latch configured to output a first decision in accordance with a detection of a sign of an input voltage signal plus an offset voltage at an edge of a clock signal;
    a lower-side sampling latch configured to output a second decision in accordance with a detection of a sign of the input voltage signal minus the offset voltage at the edge of the clock signal; and
    a decision-arbitrating latch configured to receive the first decision and the second decision and output a final decision in accordance with whichever one of the first decision and the second decision that is resolved earlier.

2. The clocked comparator of claim 1, wherein the upper-side sampling latch and the lower-side sampling latch are of the same circuit except for a polarity inversion.

3. The clocked comparator of claim 1, wherein the upper-side sampling latch comprises a differential pair, a cross-coupling inverter pair, a plurality of switches, an offset circuit, and a dummy circuit, wherein the differential pair is enabled during a first state of the clock signal, the offset circuit is enabled during the first state of the clock signal and configured to aid one side of the differential pair, said plurality of switches are configured to reset the cross-coupling inverter pair load during a second state of the clock signal, and the dummy circuit is configured to make the upper-side sampling latch balanced.

4. The clocked comparator of claim 1, wherein the decision-arbitrating latch comprises: a first pseudo-differential pair, a second pseudo-differential pair, and a regenerative load, wherein the first pseudo-differential pair is configured to receive the first decision and output a first current to the regenerative load, the second pseudo-differential pair is configured to receive the second decision and output a second current to the regenerative load, and the final decision is a state of the regenerative load.

5. The clocked comparator claim 4, wherein the decision-arbitrating latch further comprises a first inverter pair configured to receive the first decision and output a first auxiliary decision, a second inverter pair configured to receive the second decision and output a second auxiliary decision, a third pseudo-differential pair configured to receive the first auxiliary decision and output a third current to the regenerative load, and a fourth pseudo-differential pair configured to receive the second auxiliary decision and output a fourth current to the regenerative load.

6. A method comprising:
receiving an input voltage signal and a clock signal;
resolving a first decision using a first sampling latch configured to detect a sign of the input voltage signal plus an offset voltage at an edge of the clock signal;
resolving a second decision using a second sampling latch configured to detect a sign of the input voltage signal minus the offset voltage at the edge of the clock signal;
resolving a selection signal using a timing comparator configured to identify and indicate which one of the first decision and the second decision is resolved earlier; and
selecting one of the first decision and the second decision to be a final decision in accordance with the selection signal.

7. The method of claim 6, wherein the first sampling latch and the second sampling latch are of the same circuit except for a polarity inversion.

8. The method of claim 6, wherein the first sampling latch comprises a differential pair, a cross-coupling inverter pair, a plurality of switches, an offset circuit, and a dummy circuit, wherein the differential pair is enabled during a first state of the clock signal, the offset circuit is enabled during the first state of the clock signal and configured to aid one side of the differential pair, said plurality of switches are configured to reset the cross-coupling inverter pair load during a second state of the clock signal, and the dummy circuit is configured to make the first sampling latch balanced.

9. The method of claim 6, wherein the decision-arbitrating latch comprises: a first pseudo-differential pair, a second pseudo-differential pair, and a regenerative load, wherein the first pseudo-differential pair is configured to receive the first decision and output a first current to the regenerative load, the second pseudo-differential pair is configured to receive the second decision and output a second current to the regenerative load, and the final decision is a state of the regenerative load.

10. The method of claim 6, wherein the decision-arbitrating latch further comprises a first inverter pair configured to receive the first decision and output a first auxiliary decision, a second inverter pair configured to receive the second decision and output a second auxiliary decision, a third pseudo-differential pair configured to receive the first auxiliary decision and output a third current to the regenerative load, and a fourth pseudo-differential pair configured to receive the second auxiliary decision and output a fourth current to the regenerative load.

* * * * *